US007112948B2

(12) United States Patent
Daly et al.

(10) Patent No.: US 7,112,948 B2
(45) Date of Patent: Sep. 26, 2006

(54) VOLTAGE SOURCE CIRCUIT WITH SELECTABLE TEMPERATURE INDEPENDENT AND TEMPERATURE DEPENDENT VOLTAGE OUTPUTS

(75) Inventors: Michael P. Daly, Wicklow (IE); Evaldo M. Miranda, Saratoga, CA (US); David Thomson, Fremont, CA (US); A. Paul Brokaw, Tucson, AZ (US)

(73) Assignee: Analog Devices, Inc., Norwood, MA (US)

( * ) Notice: Subject to any disclaimer, the term of this patent is extended or adjusted under 35 U.S.C. 154(b) by 110 days.

(21) Appl. No.: 11/045,885

(22) Filed: Jan. 27, 2005

(65) Prior Publication Data

US 2005/0168207 A1 Aug. 4, 2005

Related U.S. Application Data

(60) Provisional application No. 60/540,704, filed on Jan. 30, 2004.

(51) Int. Cl.
*G05F 3/16* (2006.01)
*G05F 1/10* (2006.01)
*H03F 3/45* (2006.01)

(52) U.S. Cl. ........................ 323/316; 323/317; 327/538

(58) Field of Classification Search ................ 323/312, 323/313, 315–317, 907; 327/103, 535, 538–540, 327/542

See application file for complete search history.

(56) References Cited

U.S. PATENT DOCUMENTS

| | | | | |
|---|---|---|---|---|
| 5,563,504 | A | 10/1996 | Gilbert et al. | 323/316 |
| 5,757,234 | A * | 5/1998 | Lane | 330/256 |
| 5,867,012 | A | 2/1999 | Tuthill | 323/313 |
| 5,929,621 | A * | 7/1999 | Angelici et al. | 323/313 |
| 5,982,221 | A | 11/1999 | Tuthill | 327/512 |
| 6,097,239 | A | 8/2000 | Miranda, Jr. et al. | 327/512 |
| 6,369,618 | B1 * | 4/2002 | Bloodworth et al. | 327/103 |
| 6,683,489 | B1 * | 1/2004 | Eker | 327/538 |
| 6,900,689 | B1 * | 5/2005 | Kimura | 327/542 |

* cited by examiner

*Primary Examiner*—Matthew V. Nguyen
(74) *Attorney, Agent, or Firm*—Koppel, Jacobs, Patrick & Heybl

(57) ABSTRACT

A voltage source includes first and second pn junctions which conduct the outputs of respective current sources to establish respective base-emitter voltages $V_{be1}$ and $V_{be2}$ at respective nodes; $V_{be1}$ and $V_{be2}$ can each be generated with a current I or a current N*I. An amplifier A1 has its non-inverting input connected to the second node and its inverting input connected to the first node through an input capacitor; a feedback capacitor is connected between the inverting input and a third node. Switches are connected between A1's inverting input and A1's output, between the third node and A1's output, and between the third node and a circuit common point. A control circuit operates the switches and current sources during first and second operating phases to selectively produce a temperature independent output voltage or a temperature dependent output voltage.

15 Claims, 10 Drawing Sheets

VOLTAGE SOURCE CIRCUIT WITH SELECTABLE TEMPERATURE INDEPENDENT AND TEMPERATURE DEPENDENT VOLTAGE OUTPUTS

This application claims the benefit of provisional patent application No. 60/540,704 to Daly et al., filed Jan. 30, 2004.

BACKGROUND OF THE INVENTION

1. Field of the Invention

This invention relates to the field of voltage source circuits, and particularly to voltage source circuits capable of producing multiple output voltages having different characteristics.

2. Description of the Related Art

Voltage source circuits, which provide one or more output voltages, are well-known. Typically, such a circuit produces one or more output voltages, all of which have similar characteristics. For example, a voltage source might provide a temperature independent output voltage. Alternatively, an output voltage which is proportional to temperature might be provided. The desired characteristics of the circuit's output voltage would be determined based on the application for which the voltage is used.

One voltage source circuit which provides a temperature independent output voltage is described in U.S. Pat. No. 5,867,012 to Tuthill. This "switching bandgap reference" employs first and second pn junctions which conduct first and second currents to establish first and second base-emitter voltages at first and second nodes. An operational amplifier has its non-inverting input connected to the second node and its inverting input connected to the first node through an input capacitor. A feedback capacitor is connected between the amplifier's inverting input and its output, and a switch is connected across the feedback capacitor.

The circuit operates with first and second clocks which initiate first and second operating phases. During the first phase, the switch is closed such that the op amp operates as a follower, and the second output current is made greater than the first output current; the resulting $\Delta V_{be}$ between the first and second nodes is applied across the input capacitor via the op amp. During the second phase, the switch is opened and the second output current is made less than the first output current, thereby creating another $\Delta V_{be}$ term between the first and second nodes. At the end of the second phase, the amplifier's output voltage contains both proportional-to-absolute-temperature (PTAT) and complementary-to-absolute-temperature (CTAT) voltage terms. When the circuit is properly arranged, these terms sum to produce a temperature stabilized voltage at the amplifier output.

This circuit design is capable of providing an output voltage having a particular characteristic—i.e., a temperature stabilized voltage. However, it is unable to provide an output voltage having different characteristics, should such a voltage be needed by a particular application.

SUMMARY OF THE INVENTION

A voltage source circuit is presented which overcomes the problem noted above, in that it is capable of selectively providing either of two output voltages having different characteristics.

The present voltage source circuit is capable of selectively providing a temperature independent output voltage or a temperature dependent output voltage. The voltage source circuit includes a base-emitter voltage generating circuit, in which first and second pn junctions conduct the outputs of respective current sources to establish respective base-emitter voltages ($V_{be1}$ and $V_{be2}$) at respective nodes. The generating circuit is arranged such that $V_{be1}$ and $V_{be2}$ can be generated with either of two different currents (I or N*I), such that each can be at one of two different voltages.

An amplifier has its non-inverting input connected to the second node and its inverting input connected to the first node through an input capacitor; a feedback capacitor is connected between the inverting input and a third node. A first switch S1 is connected between the amplifier's inverting input and its output, a second switch S2 is connected between the third node and the amplifier's output, and a third switch S3 is connected between the third node and a circuit common point.

A control circuit is arranged to operate the switches and the base-emitter voltage generating circuit during first and second operating phases to selectively provide either a temperature independent or temperature dependent output voltage. In a preferred embodiment, the temperature dependent output voltage is a PTAT voltage. When producing a temperature independent output voltage, the control circuit's operation results in an output voltage $V_{out}$ which contains both PTAT and CTAT terms, which can be balanced to make $V_{out}$ temperature independent. Alternatively, the control circuit can operate such that $V_{out}$ is temperature dependent, such as a PTAT or CTAT voltage. The voltage source circuit could be operated such that sequentially produced output voltages have different characteristics; for example, the circuit could be arranged such that its output alternates between temperature independent and temperature dependent output voltages.

Several variations to the basic embodiment are described which provide enhanced performance and/or operational flexibility. In a preferred embodiment, a fourth switch is added and operated such that the amplifier's input offset voltage is substantially eliminated from $V_{out}$.

Further features and advantages of the invention will be apparent to those skilled in the art from the following detailed description, taken together with the accompanying drawings.

DETAILED DESCRIPTION OF THE INVENTION

Figure 1:
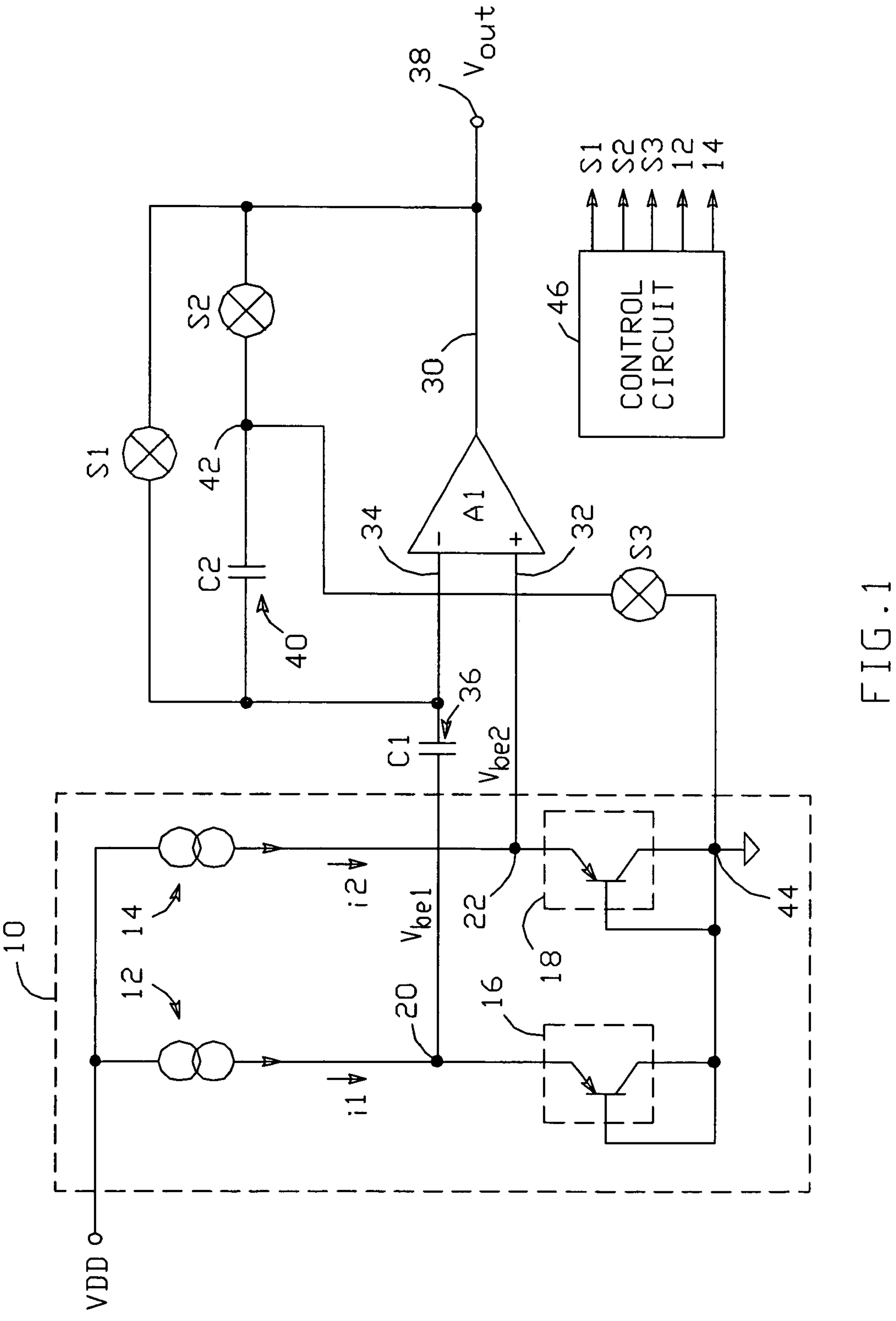
FIG. 1 is a schematic diagram of one embodiment of a voltage source circuit per the present invention.

A basic embodiment of a voltage source circuit capable of selectively providing a temperature independent or temperature dependent output voltage is shown in FIG. 1. The present voltage source circuit includes a "base-emitter voltage generating circuit" 10, which comprises first and second current sources (12, 14) which provide first and second currents (i1, i2), respectively, and first and second pn junctions (16, 18) connected to conduct i1 and i2, respectively, and thereby establish first and second base-emitter voltages $V_{be1}$ and $V_{be2}$ at first and second nodes 20 and 22, respectively. Generating circuit 10 is arranged such that $V_{be1}$ can be selectively set to a first value $V_{be1(I)}$ or a second value $V_{be1(N*I)}$, and such that $V_{be2}$ can be selectively set to a first value $V_{be2(I)}$ or a second value $V_{be2(N*I)}$. This is preferably accomplished by making current sources 12 and 14 variable, such that each of currents i1 and i2 can be set to a value I or a value N*I.

The voltage source circuit also includes an amplifier A1 having an output 30, a non-inverting input 32 and an inverting input 34. A1's non-inverting input is connected to second node 22, and its inverting input is connected to first node 20 through an input capacitor 36 having a capacitance C1. A1's output is connected to a terminal 38 which serves as the voltage source's output, identified as $V_{out}$.

Also included as part of the present voltage source circuit is a feedback capacitor 40 having a capacitance C2, connected between A1's inverting input 34 and a third node 42, a first switch S1 connected between A1's inverting input and its output 30, a second switch S2 connected between third node 42 and A1's output 30, and a third switch S3 connected between third node 42 and a circuit common point 44; common point 44 would typically be ground, but could also be a non-zero potential.

A control circuit 46 is provided to operate switches S1–S3 and base-emitter voltage generating circuit 10 during first and second operating phases to produce a temperature independent output voltage or a temperature dependent output voltage such as a PTAT or CTAT voltage. The examples below describe how the present voltage source circuit can be used to selectively provide a temperature independent or PTAT voltage. Note, however, that the present circuit is not limited to producing temperature independent and PTAT voltages. Voltages having other characteristics, such as a CTAT voltage, could also be produced by properly adjusting the circuit's switch sequencing and/or component values.

Figure 2A:
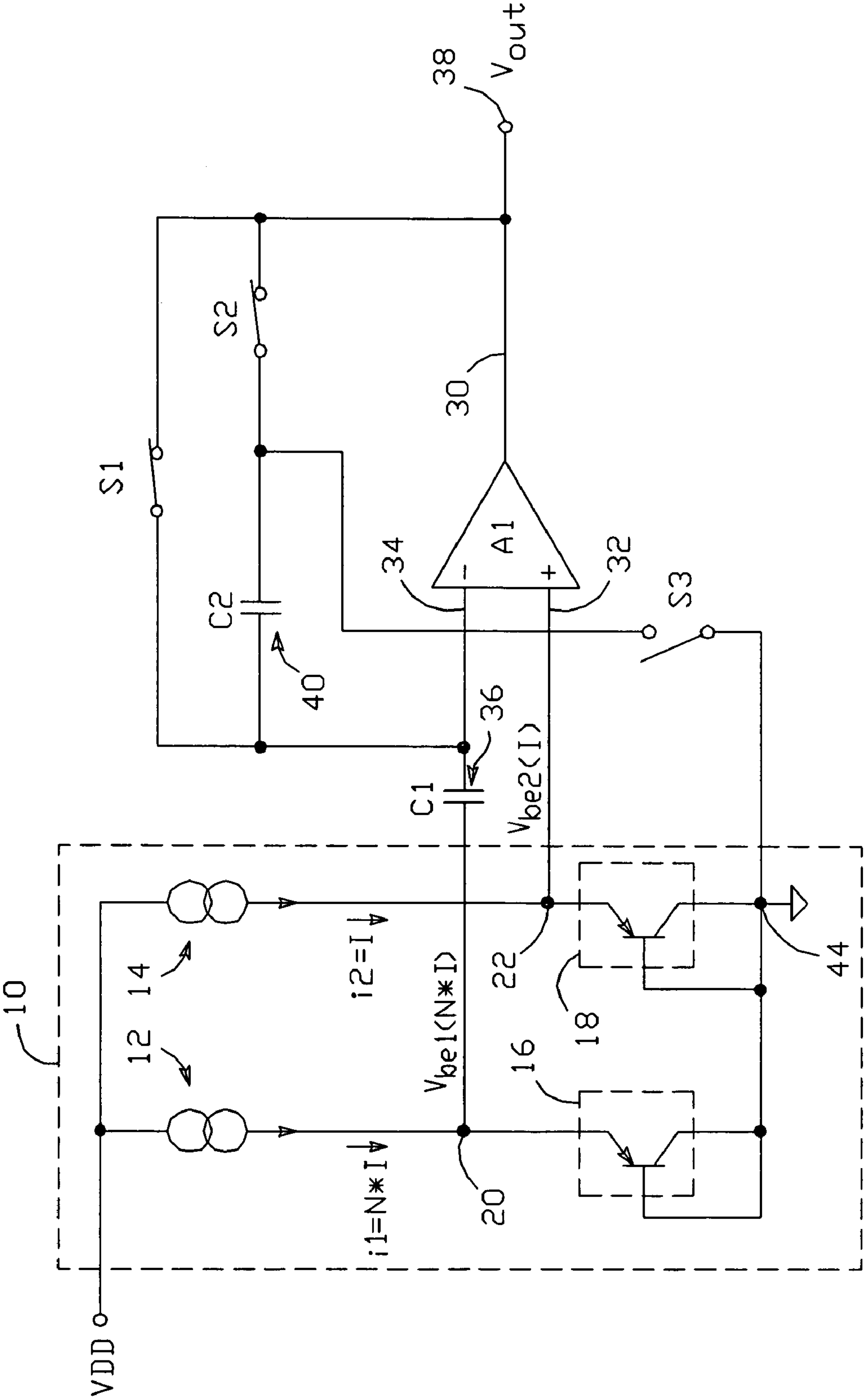
FIG. 2*a* is a schematic diagram of the voltage source circuit of FIG. 1 when providing a temperature independent output voltage during a first operating phase.
Figure 2B:
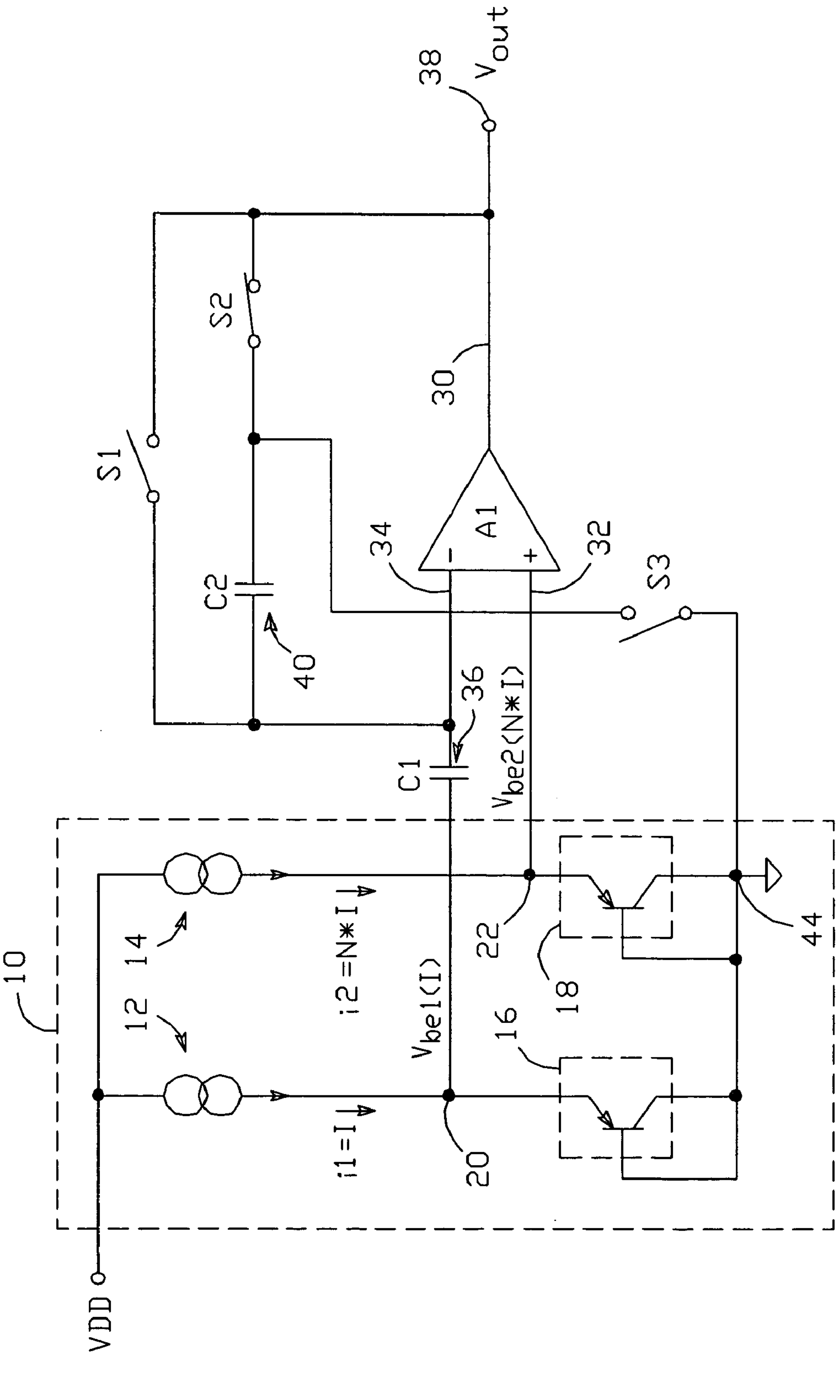
FIG. 2*b* is a schematic diagram of the voltage source circuit of FIG. 1 when providing a temperature independent output voltage during a second operating phase.
Figure 3A:
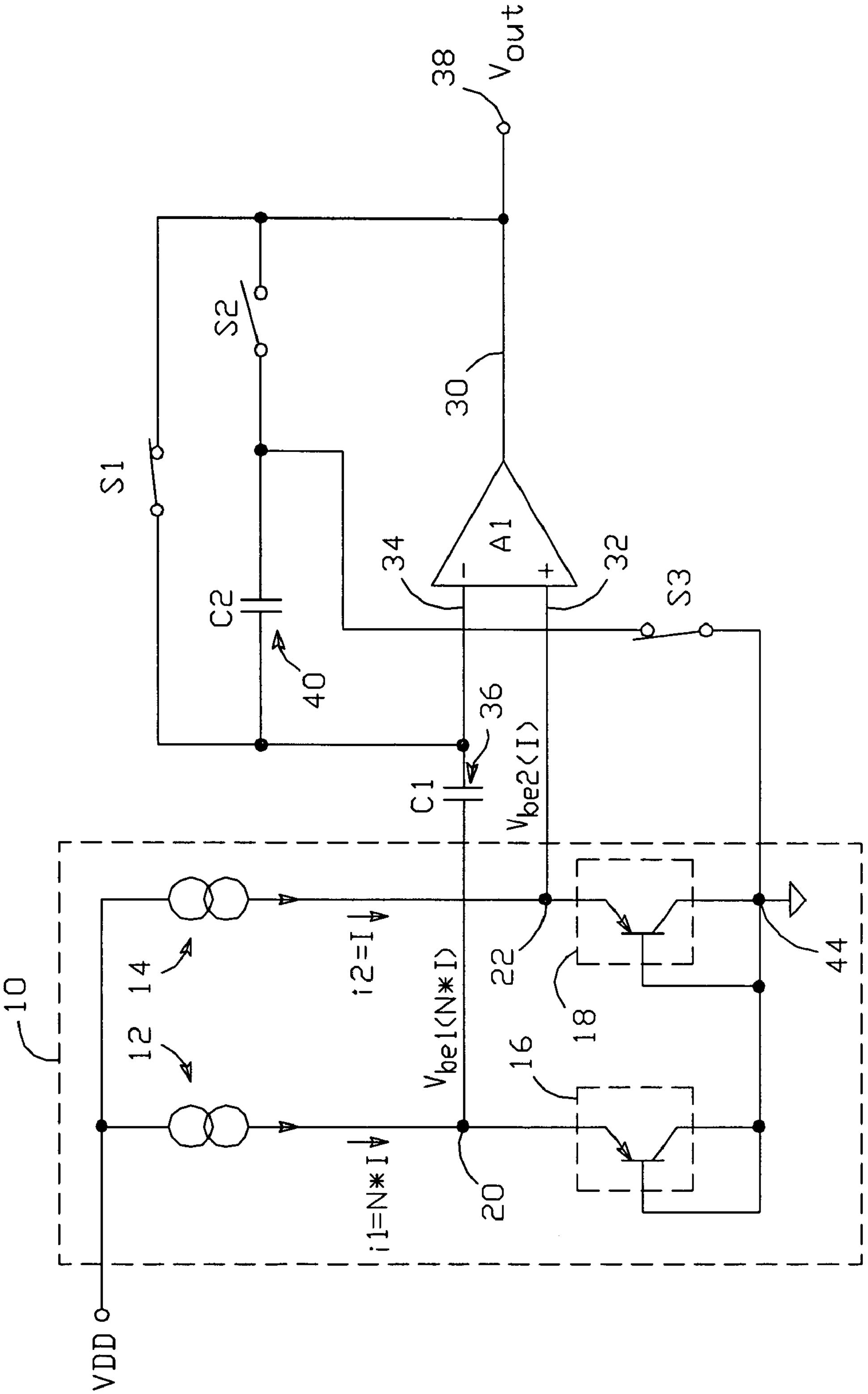
FIG. 3*a* is a schematic diagram of the voltage source circuit of FIG. 1 when providing a PTAT output voltage during a first operating phase.
Figure 3B:
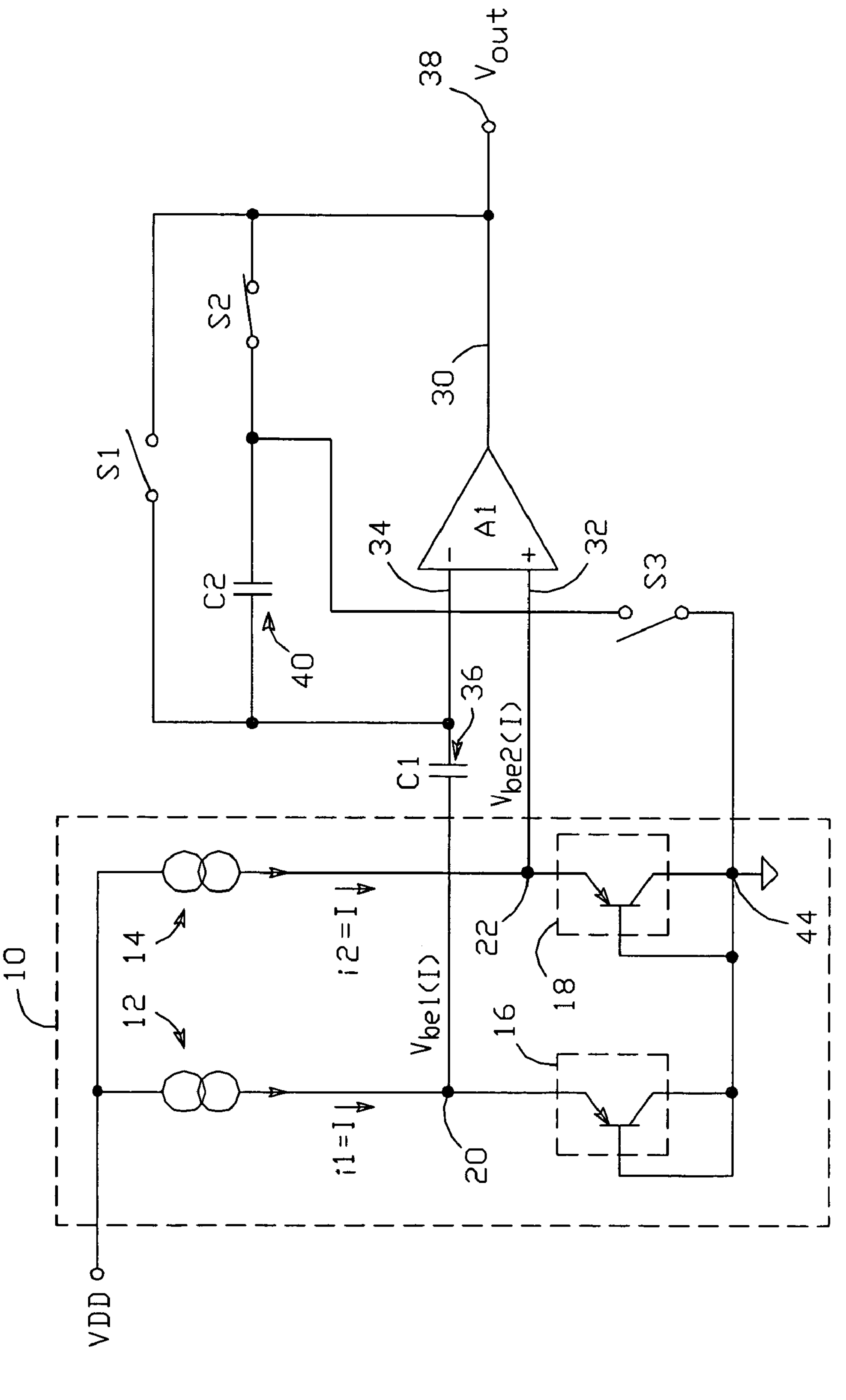
FIG. 3*b* is a schematic diagram of the voltage source circuit of FIG. 1 when providing a PTAT output voltage during a second operating phase.

When producing a temperature independent output voltage, control circuit 46 (not shown in FIGS. 2a, 2b, 3a and 3b) is arranged to, during the first operating phase (see FIG. 2a) operate base-emitter voltage generating circuit 10 such that first and second nodes 20 and 22 are at $V_{be1(N*I)}$ and $V_{be2(I)}$, respectively. This is accomplished by making output current i1 of current source 12 equal to N*I and output current i2 of current source 14 equal to I. Switches S1 and S2 are closed (and S3 is open). $V_{be2(I)}$ is applied to the non-inverting input of A1, which operates as a follower such that C1 has a voltage across it equal to $$V_{be2(I)}-V_{be1(N*I)}+V_{os},$$

where $V_{os}$ is the amplifier's input offset voltage.

During the second operating phase, control circuit 46 is arranged to (see FIG. 2b) operate base-emitter voltage generating circuit 10 such that first and second nodes 20 and 22 are at $V_{be1(I)}$ and $V_{be2(N*I)}$, respectively, accomplished by making output current i1 of current source 12 equal to I and output current i2 of current source 14 equal to N*I. Switch S1 is opened (and S3 is kept open). The charge on C1 is transferred to C2. The magnitude of the voltage lost from C1 is equal to: $2*(V_{be2(N*I)}V_{be1(I)})$; $V_{os}$ remains across C1. This charge increases the voltage on C2 by: $2*(V_{be2(N*I)}V_{be1(I)})*(C1/C2)$. The voltage at A1's inverting input 34 is $V_{be2(N*I)}+V_{os}$, such that, at the end of the second phase, output voltage $V_{out}$ is given by:

$$V_{out}=V_{be2(N*I)}+V_{os}+2*(V_{be2(N*I)}-V_{be1(I)})*(C1/C2).$$

The equation for $V_{out}$ contains a PTAT term $(V_{be2(N*I)}-V_{be1(I)})$ and a CTAT term $(V_{be2(N*I)})$; as such, output voltage $V_{out}$ can be made substantially independent of temperature by choosing appropriate values for "N" and/or for the ratio C1/C2.

When producing a PTAT output voltage, control circuit 46 is arranged to, during the first operating phase (see FIG. 3a) operate base-emitter voltage generating circuit 10 such that first and second nodes 20 and 22 are at $V_{be1(N*I)}$ and $V_{be2(I)}$, respectively, by making i1=N*I and i2=I. Switches S1 and S3 are closed (and S2 is open) such that C1 has a voltage across it equal to $V_{be2(I)}-V_{be1(N*I)}+V_{os}$, and C2 has a voltage across it equal to $V_{be2(I)}+V_{os}$.

During the second operating phase, control circuit 46 is arranged to (see FIG. 3b) operate base-emitter voltage generating circuit 10 such that first and second nodes 20 and 22 are at $V_{be1(I)}$ and $V_{be2(I)}$, respectively, accomplished by making output currents i1 and i2 both equal to I. Switch S2 is closed and switches S1 and S3 are opened, causing a charge proportional to $V_{be2(I)}-V_{be1(N*I)}=\Delta V_{be}$ to be transferred from C1 to C2. The voltage at A1's inverting input 34 remains at $V_{be2}+V_{os}$, and this voltage is subtracted from the output due to C2 having sampled this same voltage during the first operating phase. At the end of the second phase, output voltage $V_{out}$ is given by:

$$V_{out}=2*k*(C1/C2)*\Delta V_{be},$$

where k is a proportionality constant. The equation's $\Delta V_{be}$ term makes $V_{out}$ PTAT.

As noted above, the voltage source circuit could be operated such that sequentially produced output voltages have different characteristics; for example, the circuit could be arranged such that its output alternates between temperature independent and temperature dependent output voltages.

Pn junctions 16 and 18 can be implemented with simple diodes. However, they are preferably implemented with respective diode-connected PNP transistors as shown. If the present voltage source is used with CMOS circuitry, pn junctions 16 and 18 can be implemented with respective parasitic substrate bipolar transistors. For simplicity, the areas of pn junction 16 and 18 are preferably equal, though this is not essential.

Figure 4:
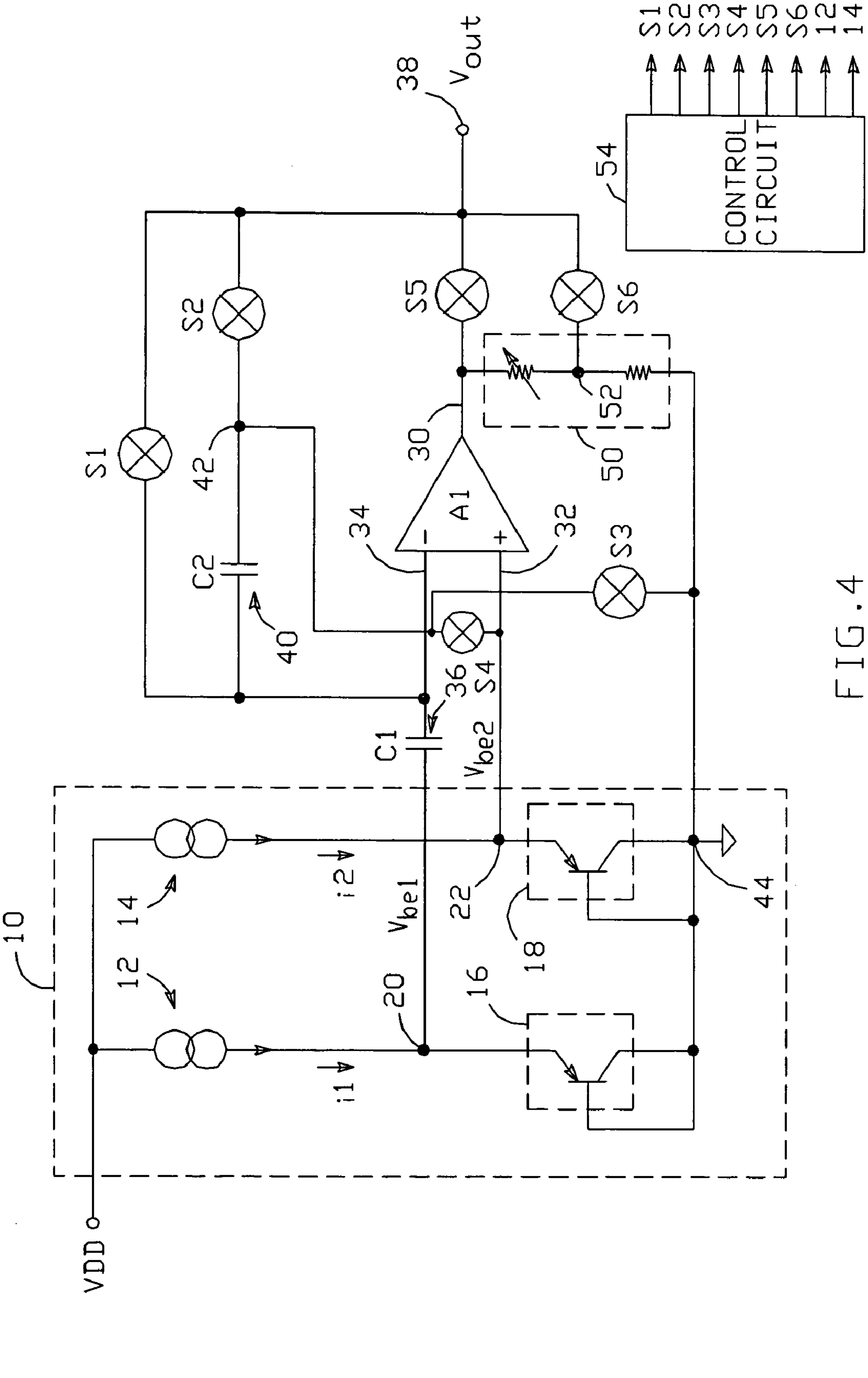
FIG. 4 is a schematic diagram of a preferred embodiment of a voltage source circuit per the present invention.

A preferred embodiment of the invention, capable of selectively providing a temperature independent or a PTAT output voltage, and which substantially reduces or eliminates the magnitude of A1's input offset voltage in output voltage $V_{out}$, is shown in FIG. 4. This embodiment is similar to the one discussed above, except for the addition of a switch S4 connected between A1's non-inverting input 32 and node 42, a resistive divider 50 connected between the output 30 of amplifier A1, a switch S5 connected between A1's output 30 and output terminal 38, and a switch S6 connected between the divider output 52 and output terminal 38. Also note that here, switches S1 and S2 are connected to terminal 38 rather than A1's output 30.

Figure 5A:
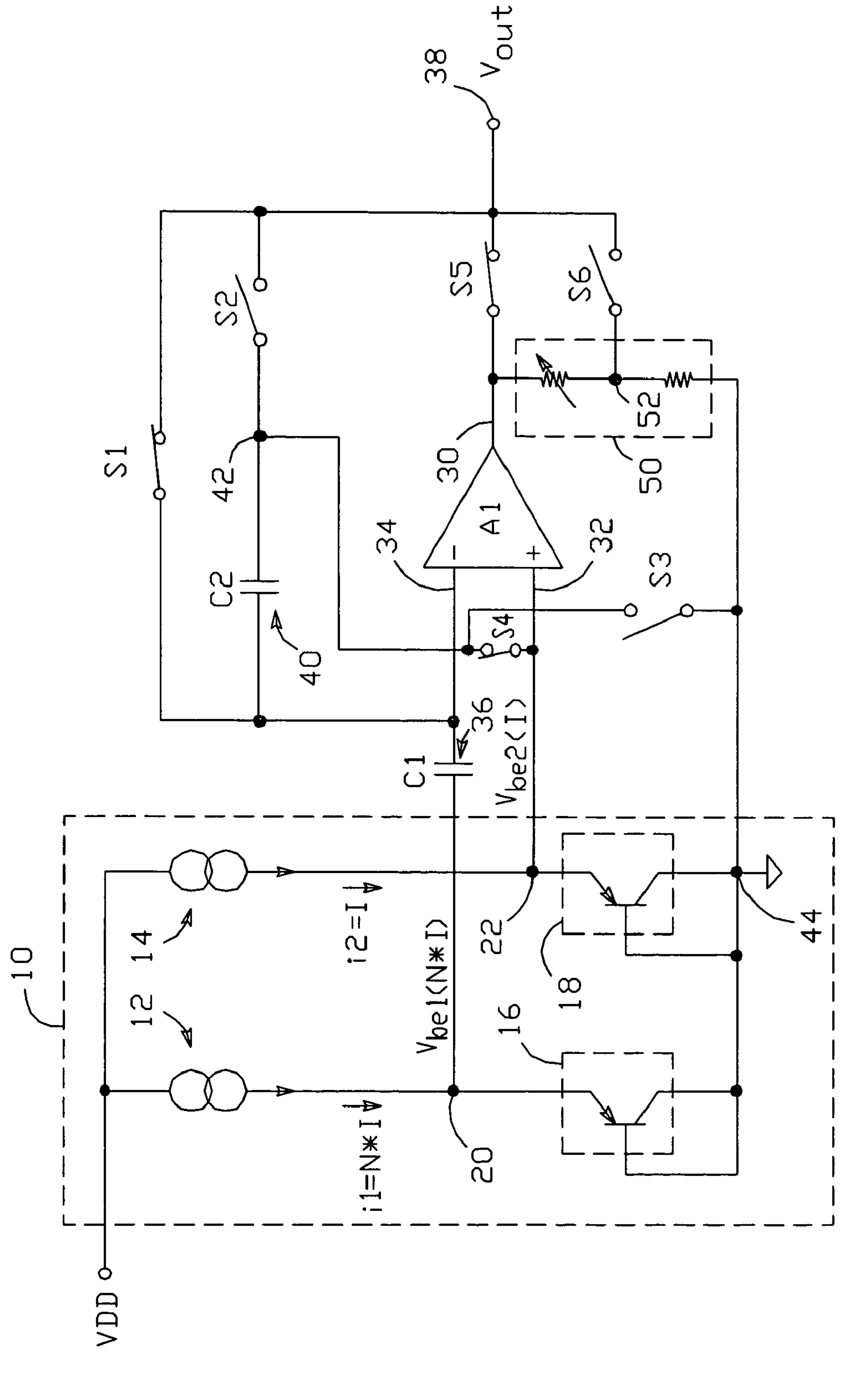
FIG. 5*a* is a schematic diagram of the voltage source circuit of FIG. 4 when providing a temperature independent output voltage during a first operating phase.
Figure 5B:
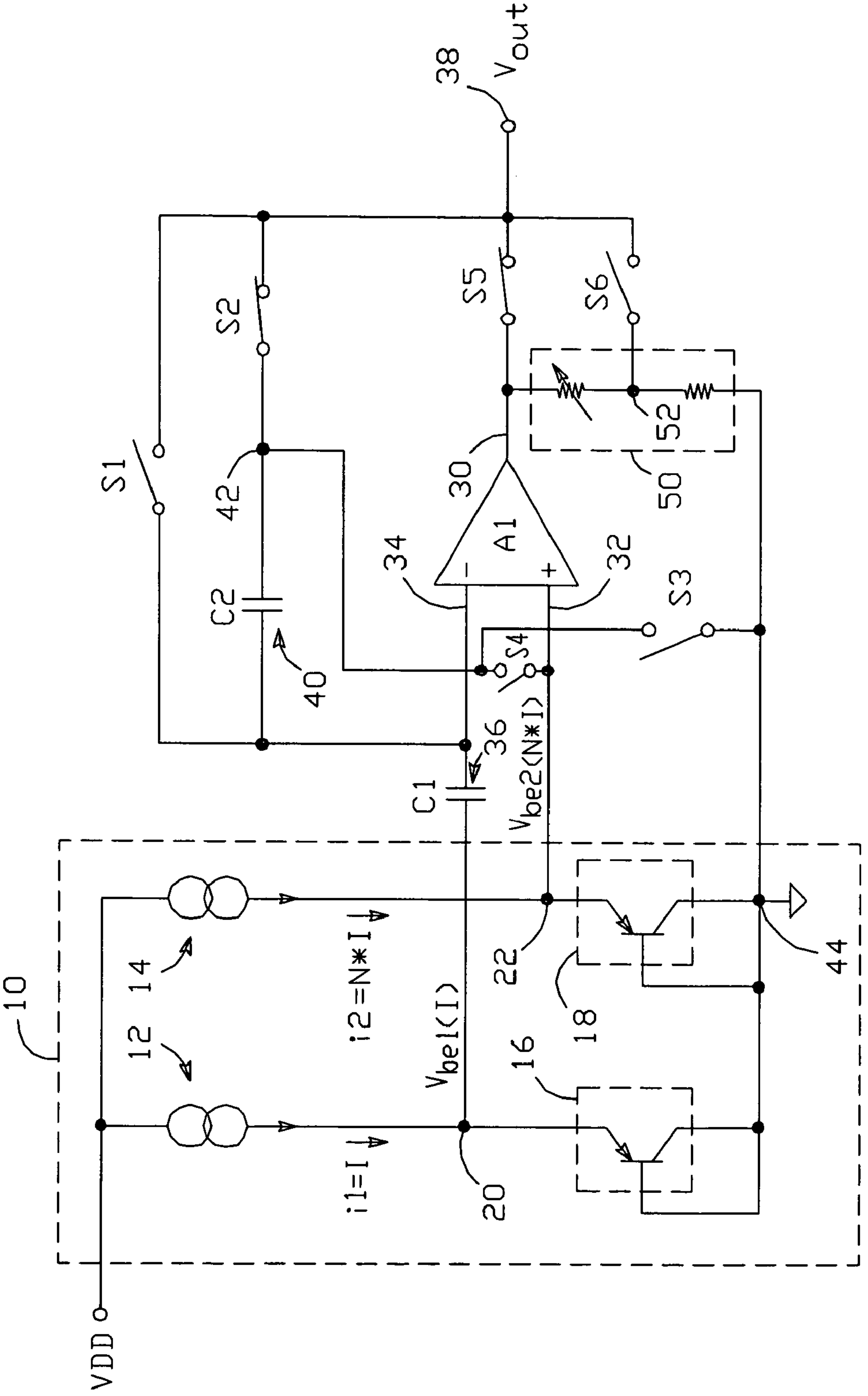
FIG. 5*b* is a schematic diagram of the voltage source circuit of FIG. 4 when providing a temperature independent output voltage during a second operating phase.
Figure 6A:
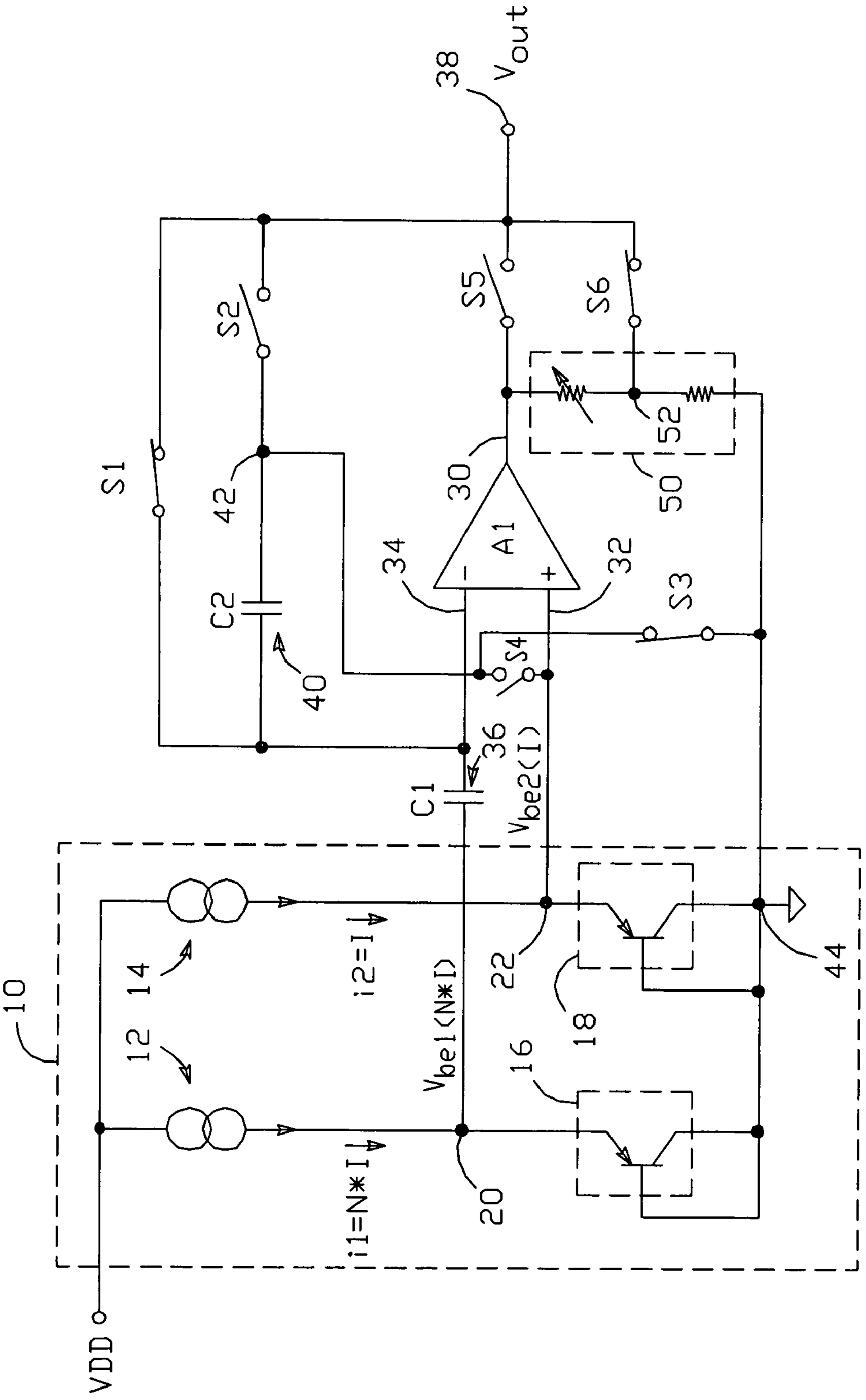
FIG. 6a is a schematic diagram of the voltage source circuit of FIG. 4 when providing a PTAT output voltage during a first operating phase.
Figure 6B:
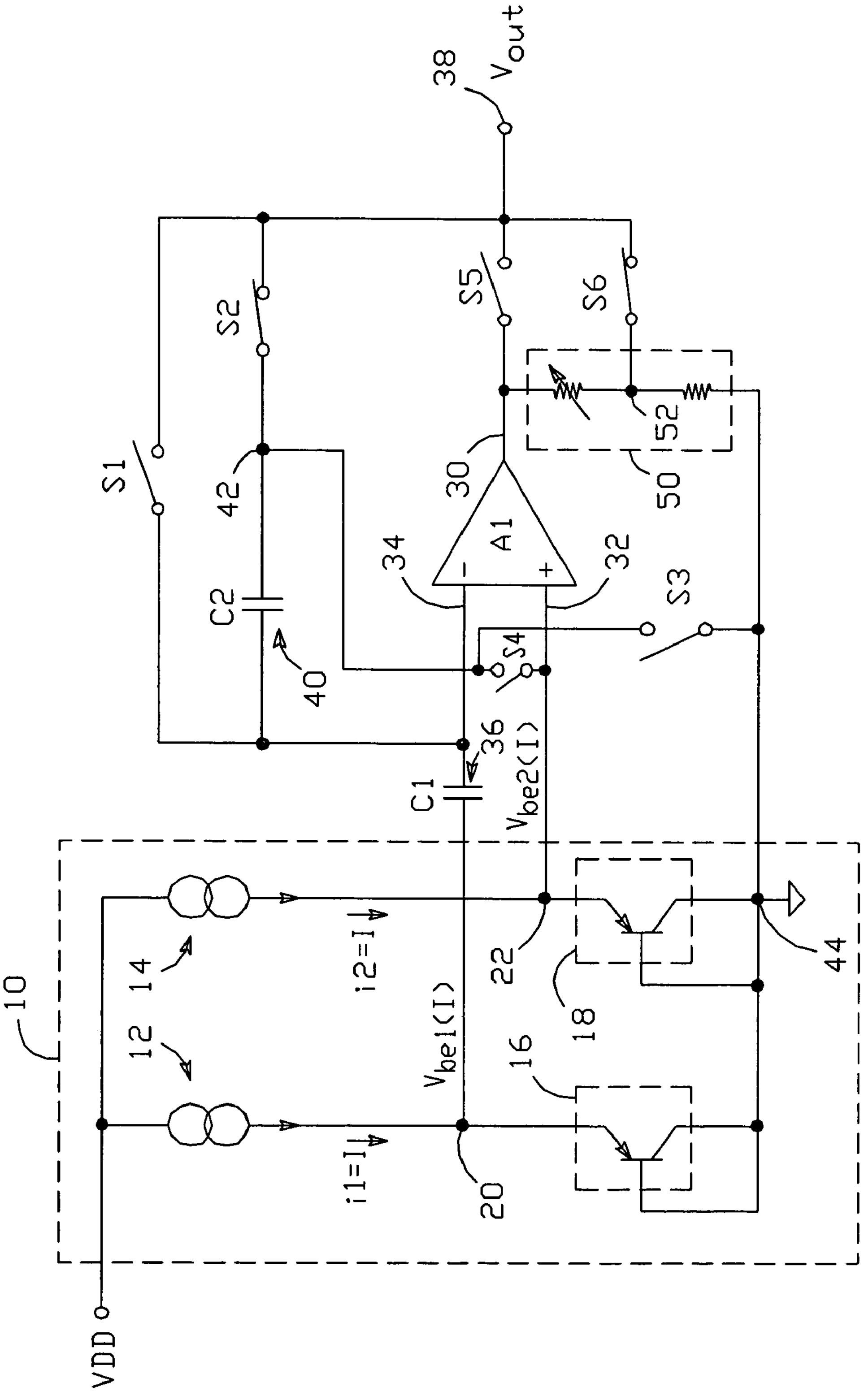
FIG. 6b is a schematic diagram of the voltage source circuit of FIG. 4 when providing a PTAT output voltage during a second operating phase.

Here, control circuit 54 operates switches S1–S6 and base-emitter voltage generating circuit 10 during first and second operating phases to produce a temperature independent output voltage or a PTAT output voltage. When producing a temperature independent output voltage, control circuit 54 (not shown in FIGS. 5*a*, 5*b*, 6*a* and 6*b*) is arranged to, during the first operating phase (see FIG. 5*a*) operate base-emitter voltage generating circuit 10 such that first and second nodes 20 and 22 are at $V_{be1(N*I)}$ and $V_{be2(I)}$, respectively, by making output current i1=N*I and i2=I. As before, A1 acts as a follower. Switches S1 and S5 are closed such that C1 has a voltage across it equal to $V_{be2(I)}-V_{be1(N*I)}+V_{os}$, and S4 is closed such that C2 has a voltage across it equal to $V_{os}$; switches S2, S3 and S6 are open.

During the second operating phase, control circuit 54 is arranged to (see FIG. 5*b*) operate base-emitter voltage generating circuit 10 such that first and second nodes 20 and 22 are at $V_{be1(I)}$ and $V_{be2(N*I)}$, respectively, by making i1=I and i2=N*I. Switches S1 and S4 are opened, S2 is closed, and the other switches are unchanged. The charge on C1 is transferred to C2. The magnitude of the voltage lost from C1 is equal to $2*(V_{be2(N*I)}-V_{be1(I)})$; $V_{os}$ remains across C1. This charge increases the voltage on C2 by $2*(V_{be2(N*I)}-V_{be1(I)})*(C1/C2)$. The voltage at A1's inverting input 34 is $V_{be2(N*I)}+V_{os}$, such that, at the end of the second phase, output voltage $V_{out}$ is independent of the offset voltage, as $V_{os}$ gets subtracted by C2 because it has sampled this voltage during the first operating phase. The final result is an output voltage $V_{out}$ given by:

$$V_{out}=V_{be2(N*I)}+2*(V_{be2(N*I)}-V_{be1(I)})*(C1/C2)$$

The equation for $V_{out}$ contains a PTAT term $(V_{be2(N*I)}-V_{be1(I)})$ and a CTAT term $(V_{be2(N*I)})$; as such, output voltage $V_{out}$ can be made substantially independent of temperature by choosing appropriate values for "N" and/or for the ratio C1/C2.

When producing a PTAT output voltage, control circuit 54 is arranged to, during the first operating phase (see FIG. 6*a*) operate base-emitter voltage generating circuit 10 such that first and second nodes 20 and 22 are at $V_{be1(N*I)}$ and $V_{be2(I)}$, respectively, by making output current i1=N*I and i2=I. Switches S1, S3 and S6 (which connects divider output 52 to output terminal 38) are closed such that C1 has a voltage across it equal to $V_{be2(I)}-V_{be1(N*I)}+V_{os}$ and C2 has a voltage across it equal to $V_{be2(I)}+V_{os}$. Switches S2 and S4 are open.

During the second operating phase, control circuit 54 is arranged to (see FIG. 6*b*) operate base-emitter voltage generating circuit 10 such that first and second nodes 20 and 22 are at $V_{be1(I)}$ and $V_{be2(I)}$, respectively, by making i1=i2=I. Switch S2 is closed and switches S1 and S3 are opened, causing a charge proportional to $V_{be2(I)}-V_{be1(N*I)}=\Delta V_{be}$ to be transferred from C1 to C2. The voltage at A1's inverting input 34 remains at $V_{be2(I)}+V_{os}$, and this voltage is subtracted from the output due to C2 having sampled this same voltage during the first operating phase. At the end of the second phase, output voltage $V_{out}$ is given by:

$$V_{out}=2*k*(C1/C2)*\Delta V_{be},$$

where k is a proportionality constant. The equation's $\Delta V_{be}$ term makes $V_{out}$ PTAT.

The constant of proportionality, k, can be altered using the variable resistor in divider 50, and/or by varying the capacitor ratio C1/C2. Using a resistive divider as shown is preferred (though not essential), as this allows C1/C2 to be independently selected as needed to provide the temperature independent output voltage.

The configuration shown in FIG. 4 is preferred because it enables output voltage $V_{out}$ to be substantially free of amplifier offset. In addition, the common mode voltage (i.e., the average input voltage into the amplifier), does not change from cycle to cycle, which prevents $V_{out}$ from being adversely affected by parasitic capacitance at the inputs to amplifier A1.

The base-emitter voltage generating circuit required by the present invention could be implemented in a number of different ways. As noted above, pn junctions 16 and 18 could be diodes or transistors, preferably—but not necessarily—of equal size. Current sources 12 and 14 could provide output currents which vary in response to respective control signals, or multiple current sources providing fixed output currents could be connected to pn junctions 16 and 18 via a switching network as needed to provide the desired current (N or N*I).

While particular embodiments of the invention have been shown and described, numerous variations and alternate embodiments will occur to those skilled in the art. Accordingly, it is intended that the invention be limited only in terms of the appended claims.

We claim:

1. A voltage source circuit capable of selectively providing temperature independent and temperature dependent output voltages, comprising:

- an output terminal which provides said voltage source's output voltage $V_{out}$;
- a base-emitter voltage generating circuit, comprising:
  - a first current source which provides a current i1 which is selectively set to a value I or a value N*I;
  - a second current source which provides a current i2 which is selectively set to a value I or a value N*I;
  - first and second pn junctions connected to conduct i1 and i2 and thereby establish first and second base-emitter voltages $V_{be1}$ and $V_{be2}$ at first and second nodes, respectively, said voltage $V_{be1}$ set to a value $V_{be1(I)}$ when i1=I or to a second value $V_{be1(N*I)}$ when i1=N*I, and said voltage $V_{be2}$ set to a value $V_{be2(I)}$ when i2=I or to a second value $V_{be2(N*I)}$ when i2=N*I;
- an amplifier having an output, a non-inverting input and an inverting input, said non-inverting input connected to said second node, said inverting input connected to said first node through an input capacitor having a capacitance C1, and said amplifier's output coupled to said output terminal;
- a feedback capacitor having a capacitance C2 connected between said inverting input and a third node;
- a first switch connected between said amplifier's inverting input and a fourth node;
- a second switch connected between said third node and said fourth node, said fourth node coupled to the output of said amplifier;

a third switch connected between said third node and a circuit common point; and a control circuit arranged to selectively operate said switches and said base-emitter voltage generating circuit to produce a temperature independent output voltage or a temperature dependent output voltage.

2. The voltage source circuit of claim 1, wherein said voltage source circuit is arranged such that said temperature independent output voltage is approximately given by:

$$V_{out}=V_{be2(N*I)}+2*(C1/C2)*(V_{be2(N*I)}-V_{be1(I)}),$$

and said temperature dependent output voltage is approximately given by:

$$V_{out}=2*k*(C1/C2)*(V_{be2(I)}-V_{be1(N*I)}),$$

where k is a proportionality constant.

3. A voltage source circuit capable of selectively providing a temperature independent or a proportional-to-absolute-temperature (PTAT) output voltage, comprising:

an output terminal which provides said voltage source's output voltage $V_{out}$;

a base-emitter voltage generating circuit, comprising:

a first current source which provides a current i1 which is selectively set to a value I or a value N*I;

a second current source which provides a current i2 which is selectively set to a value I or a value N*I;

first and second pn junctions connected to conduct i1 and i2 and thereby establish first and second base-emitter voltages $V_{be1}$ and $V_{be2}$ at first and second nodes, respectively, said voltage $V_{be1}$ set to a value $V_{be1(I)}$ when i1=I or to a second value $V_{be1(N*I)}$ when i1=N*I, and said voltage $V_{be2}$ set to a value $V_{be2(I)}$ when i2=I or to a second value $V_{be2(N*I)}$ when i2=N*I;

an amplifier having an output, a non-inverting input and an inverting input, said non-inverting input connected to said second node, said inverting input connected to said first node through an input capacitor having a capacitance C1, and said amplifier's output coupled to said output terminal;

a feedback capacitor having a capacitance C2 connected between said inverting input and a third node;

a first switch connected between said amplifier's inverting input and a fourth node;

a second switch connected between said third node and said fourth node, said fourth node coupled to the output of said amplifier;

a third switch connected between said third node and a circuit common point; and a control circuit arranged to selectively operate said switches and said base-emitter voltage generating circuit to produce a temperature independent output voltage approximately given by:

$$V_{out}=V_{be2(N*I)}+2*(C1/C2)*(V_{be2(N*I)}V_{be1(I)}),$$

or a PTAT output voltage approximately given by:

$$V_{out}=2*k*(C1/C2)*(V_{be2(I)}-V_{be1(N*I)}),$$

where k is a proportionality constant.

4. The voltage source circuit of claim 3, further compromising a fourth switch connected between the non-inverting input of said amplifier and said third node, said control circuit when producing a temperature independent output voltage further arranged to operate said fourth switch such that said amplifier's input offset voltage is substantially eliminated from $V_{out}$.

5. A voltage source circuit capable of selectively providing a temperature independent or a proportional-to-absolute-temperature (PTAT) output voltage, comprising:

an output terminal which provides said voltage source's output voltage $V_{out}$;

a base-emitter voltage generating circuit, comprising:

a first current source which provides a current i1 which is selectively set to a value I or a value N*I;

a second current source which provides a current i2 which is selectively set to a value I or a value N*I;

first and second pn junctions connected to conduct i1 and i2 and thereby establish first and second base-emitter voltages $V_{be1}$ and $V_{be2}$ at first and second nodes, respectively, said voltage $V_{be1}$ set to a value $V_{be1(I)}$ when i1=I or to a second value $V_{be1(N*I)}$ when i1=N*I, and said voltage $V_{be2}$ set to a value $V_{be2(I)}$ when i2=I or to a second value $V_{be2(N*I)}$ when i2=N*I;

an amplifier having an output, a non-inverting input and an inverting input, said non-inverting input connected to said second node, said inverting input connected to said first node through an input capacitor having a capacitance C1, and said amplifier's output coupled to said output terminal;

a feedback capacitor having a capacitance C2 connected between said inverting input and a third node;

a first switch S1 connected between said amplifier's inverting input and a fourth node;

a second switch S2 connected between said third node and said fourth node, said fourth node coupled to the output of said amplifier;

a third switch S3 connected between said third node and a circuit common point; and a control circuit which operates said switches and said base-emitter voltage generating circuit during first and second operating phases to produce a temperature independent output voltage or a PTAT output voltage;

said control circuit when producing a temperature independent output voltage arranged to:

during said first operating phase:

operate said base-emitter voltage generating circuit such that said first and second nodes are at $V_{be1(N*I)}$ and $V_{be2(I)}$, respectively, close S1 and S2 such that C1 has a voltage across it equal to $V_{be2(I)}-V_{be1(N*I)}+V_{os}$, where $V_{os}$ is the amplifier's input offset voltage, and during said second operating phase:

operate said base-emitter voltage generating circuit such that said first and second nodes are at $V_{be1(I)}$ and $V_{be2(N*I)}$, respectively, and open S1 and S3 such that, at the end of said second phase, said output voltage $V_{out}$ is given by:

$$V_{out}=V_{be2(N*I)}+2*(C1/C2)*(V_{be2(N*I)}-V_{be1(I)})+V_{os},$$

said control circuit when producing a PTAT output voltage arranged to:

during said first operating phase:

operate said base-emitter voltage generating circuit such that said first and second nodes are at $V_{be1(N*I)}$ and $V_{be2(I)}$, respectively, and close S1 and S3 and open S2 such that C1 has a voltage across it equal to $V_{be2(I)}-V_{be1(N*I)}+V_{os}$ and C2 has a voltage across it equal to $V_{be2}+V_{os}$, and during said second operating phase:

operate said base-emitter voltage generating circuit such that said first and second nodes are at $V_{be1(I)}$ and $V_{be2(I)}$, respectively, and close S2 and open S1 and S3 such that, at the end of said second phase, said output voltage $V_{out}$ is given by:

$$V_{out}=2*k*(C1/C2)*(V_{be2(I)}-V_{be1(N*I)}),$$

where k is a proportionality constant.

6. The voltage source circuit of claim 5, wherein first and second pn junctions comprise the base-emitter junctions of respective PNP transistors.

7. The voltage source circuit of claim 5, further comprising a fourth switch S4 connected between the non-inverting input of said amplifier and said third node;

said control circuit when producing a temperature independent output voltage further arranged to:

during said first operating phase:

close S4 such that C2 has a voltage across it equal to $V_{os}$, and during said second operating phase:

open S4 such that, at the end of said second phase, said output voltage $V_{out}$ is given by:

$$V_{out}=V_{be2(N*I)}+2*(C1/C2)*(V_{be2(N*I)}-V_{be1(I)});$$

said control circuit when producing a PTAT output voltage further arranged to hold S4 open during said first and second operating phases.

8. The voltage source circuit of claim 5, wherein said fourth node and said output terminal are connected to the output of said amplifier.

9. The voltage source circuit of claim 5, further comprising a resistive divider circuit connected between said amplifier output and said circuit common point, said voltage source circuit arranged to connect said fourth node and said output terminal to the output of said divider when producing a PTAT output voltage.

10. The voltage source circuit of claim 9, wherein said resistive divider circuit comprises:

a first resistor connected between the output of said amplifier and a fifth node;

a second resistor connected between said fifth node and said circuit common point;

a fourth switch S4 connected between the output of said amplifier and said output terminal; and a fifth switch S5 connected between said fifth node and said output terminal;

said control circuit when producing a temperature independent output voltage further arranged to close S5 and open S6;

said control circuit when producing a PTAT output voltage arranged to open S5 and close S6, said output voltage $V_{out}$ taken at the output of said amplifier.

11. The voltage source circuit of claim 10, wherein one of said first and second resistors is an adjustable resistor.

12. The voltage source circuit of claim 11, wherein said adjustable resistor is adjusted to obtain a desired value for proportionality constant k.

13. The voltage source circuit of claim 5, wherein first and second pn junctions comprise the base-emitter junctions of respective PNP transistors, said PNP transistors being parasitic substrate bipolar transistors.

14. A voltage source circuit capable of selectively providing a temperature independent or proportional-to-absolute-temperature (PTAT) output voltage, comprising:

an output terminal which provides said voltage source's output voltage $V_{out}$;

a base-emitter voltage generating circuit, comprising:

a first current source which provides a current i1 which is selectively set to a value I or a value N*I;

a second current source which provides a current i2 which is selectively set to a value I or a value N*I;

first and second pn junctions comprising the base-emitter junctions of respective bipolar transistors, connected to conduct i1 and i2 and thereby establish first and second base-emitter voltages $V_{be1}$ and $V_{be2}$ at first and second nodes, respectively, said voltage $V_{be1}$ set to a value $V_{be1(I)}$ when i1=I or to a second value $V_{be1(N*I)}$ when i1=N*I, and said voltage $V_{be2}$ set to a value $V_{be2(I)}$ when i2=I or to a second value $V_{be2(N*I)}$ when i2=N*I;

an amplifier having an output, a non-inverting input and an inverting input, said non-inverting input connected to said second node, said inverting input connected to said first node through an input capacitor having a capacitance C1, and said amplifier's output coupled to said output terminal;

a feedback capacitor having a capacitance C2 connected between said inverting input and a third node;

a first switch S1 connected between said amplifier's inverting input and a fourth node;

a second switch S2 connected between said third node and said fourth node, said fourth node coupled to the output of said amplifier;

a third switch S3 connected between said third node and a circuit common point;

a fourth switch S4 connected between the non-inverting input of said amplifier and said third node; and a control circuit which operates said switches and said base-emitter voltage generating circuit during first and second operating phases to produce a temperature independent output voltage or a PTAT output voltage;

said control circuit when producing a temperature independent output voltage arranged to:

during said first operating phase:

operate said base-emitter voltage generating circuit such that said first and second nodes are at $V_{be1(N*I)}$ and $V_{be2(I)}$, respectively, close S1 such that C1 has a voltage across it equal to $V_{be2(I)}-V_{be1(N*I)}+V_{os}$ and close S4 such that C2 has a voltage across it equal to $V_{os}$, where $V_{os}$, is the amplifier's input offset voltage, and during said second operating phase:

operate said base-emitter voltage generating circuit such that said first and second nodes are at $V_{be1(I)}$ and $V_{be2(N*I)}$, respectively, and open S1, S3 and S4 and close S2 such that, at the end of said second phase, said output voltage $V_{out}$ is given by:

$$V_{out}=V_{be2(N*I)}+2*(C1/C2)*(V_{be2(N*I)}-V_{be1(I)});$$

said control circuit when producing a PTAT output voltage arranged to:

during said first operating phase:

operate said base-emitter voltage generating circuit such that said first and second nodes are at $V_{be1(N*I)}$ and $V_{be2(I)}$, respectively, and close S1 and S3 and open S2 and S4 such that C1 has a voltage across it equal to $V_{be2}-V_{be1}+V_{os}$ and C2 has a voltage across it equal to $V_{be2}+V_{os}$, and during said second operating phase:

operate said base-emitter voltage generating circuit such that said first and second nodes are at $V_{be1(I)}$ and $V_{be2(I)}$, respectively, and close S2 and open S1 and S3 such that, at the end of said second phase, said output voltage $V_{out}$ is given by:

$$V_{out}=2*k*(C1/C2)*\Delta V_{be},$$

where k is a proportionality constant.

15. The voltage source circuit of claim 14, further comprising a resistive divider circuit, comprising:

a first resistor connected between the output of said amplifier and a fifth node;

a second resistor connected between said fifth node and said circuit common point;

a fifth switch S5 connected between the output of said amplifier and said output terminal; and a sixth switch S6 connected between said fifth node and said output terminal;

said control circuit when producing a temperature independent output voltage further arranged to close S5 and open S6, said temperature independent output voltage taken at said output terminal;

said control circuit when producing a PTAT output voltage arranged to open S5 and close S6, said PTAT output voltage taken at the output of said amplifier.

* * * * *